United States Patent [19]

Graser et al.

[11] 4,379,934
[45] Apr. 12, 1983

[54] PROCESS FOR TWO-DIMENSIONALLY CONCENTRATING LIGHT, AND NOVEL PERYLENE-3,4,9,10-TETRACARBOXYLIC ACID DIIMIDES

[75] Inventors: Fritz Graser; Guenther Seybold, both of Ludwigshafen, Fed. Rep. of Germany

[73] Assignee: BASF Aktiengesellschaft, Ludwigshafen, Fed. Rep. of Germany

[21] Appl. No.: 214,228

[22] Filed: Dec. 8, 1980

[30] Foreign Application Priority Data

Jan. 19, 1980 [DE] Fed. Rep. of Germany ....... 3001857
Jan. 19, 1980 [DE] Fed. Rep. of Germany ....... 3001858

[51] Int. Cl.³ ................... C07D 471/06; C09B 3/14
[52] U.S. Cl. .................................. 546/37; 252/301.25
[58] Field of Search ..................... 252/301.25; 546/37

[56] References Cited

U.S. PATENT DOCUMENTS 4,110,123  8/1978  Goetzberger ................. 136/247

FOREIGN PATENT DOCUMENTS

| 656105 | 5/1965 | Belgium . |
| 2210170 | 9/1973 | Fed. Rep. of Germany . |
| 2525630 | 12/1976 | Fed. Rep. of Germany . |
| 2851513 | 6/1980 | Fed. Rep. of Germany . |
| 78658 | 7/1962 | France . |
| 2148510 | 3/1973 | France . |
| 2153350 | 5/1973 | France . |
| 562852 | 6/1975 | Switzerland . |
| 852202 | 10/1960 | United Kingdom . |
| 2019026 | 10/1979 | United Kingdom . |

*Primary Examiner*—F. Edmundson
*Attorney, Agent, or Firm*—Oblon, Fisher, Spivak, McClelland & Maier

[57] ABSTRACT

A process for concentrating light by means of fluorescent compounds of the formula

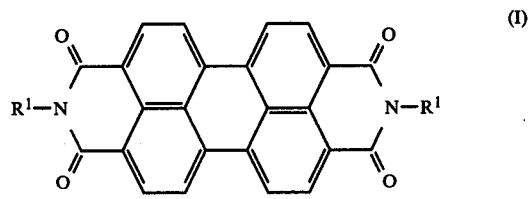

where the $R^1$'s independently of one another are ortho-substituted aromatic or heterocyclic radicals which do not contain groups which confer solubility in water, and novel perylene-3,4,9,10-tetracarboxylic acid diimides of the formula I, where $R^1$ is

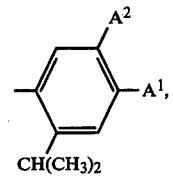

$A^1$ and $A^2$ being hydrogen, or one of $A^1$ or $A^2$ being isopropyl and the other being hydrogen.

The compounds I are very lightfast and convert incident light into fluorescent light with high efficiency.

3 Claims, No Drawings

PROCESS FOR TWO-DIMENSIONALLY CONCENTRATING LIGHT, AND NOVEL PERYLENE-3,4,9,10-TETRACARBOXYLIC ACID DIIMIDES

The present invention relates to a process for concentrating light by means of fluorescent compounds, and to novel perylene-3,4,9,10-tetracarboxylic acid diimides.

German Laid-Open Applications DOS Nos. 2,620,115 and DOS 2,554,226 disclose apparatus by means of which visible light can be concentrated, in a plastic sheet, by means of embedded fluorescence centers, onto a small area.

The compounds required as fluorescence centers in such apparatus must, in particular in the case of the conversion of light energy into electrical energy, be very lightfast so that the apparatus has an adequate working life for the particular application. This means that the compounds used as fluorescence centers must be very fast to light in the plastics used.

It is an object of the present invention to provide compounds suitable for use as fluorescence centers, for the conventional type of apparatus for concentrating light, which compounds exhibit high fluorescence coupled with great lightfastness in the medium used, and exert no adverse effect on the medium.

We have found that this object is achieved and that excellent results are obtained in two-dimensionally concentrating light by means of fluorescent compounds in a plastic sheet, if the fluorescent compounds used are those of the formula

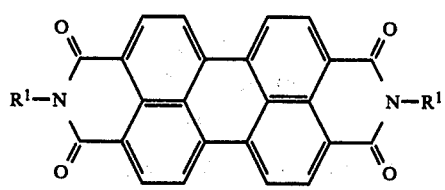

(I)

where the two $R^1$'s independently of one another are ortho-substituted aromatic or heterocyclic radicals which do not contain groups which confer solubility in water.

Examples of suitable groups (substituents) which do not confer solubility in water include the halogens, e.g. bromine and preferably chlorine, $C_1$-$C_{12}$-alkyl, $C_1$-$C_8$-alkoxy, phenyl, $C_7$-$C_{10}$-phenylalkyl, phenylsulfonyl, $C_2$-$C_5$-alkanoylamino, aroylamino, e.g. benzoylamino, carbamyl, N-$C_1$-$C_4$-alkylcarbamyl, sulfamyl, N-phenylsulfamyl, N-$C_1$-$C_4$-alkylsulfamyl, N,N-bis-($C_1$-$C_4$-alkyl)-sulfamyl, sulfamyl in which the amide nitrogen forms part of a 5-membered or 6-membered saturated heterocyclic ring, and furfur-2-yl, the phenyl radicals, where present in any of the above, being unsubstituted or substituted by chlorine, bromine, $C_1$-$C_4$-alkyl or $C_1$-$C_4$-alkoxy, the number of these substituents being up to 3, but preferably 0, 1 or 2. If the number is 2 or 3, the substituents may be identical or different.

The invention further relates to novel perylene-3,4,9,10-tetracarboxylic acid diimides of the formula

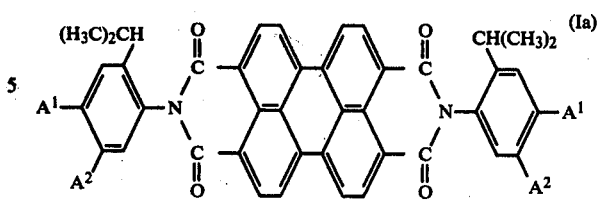

(Ia)

where $A^1$ and $A^2$ are hydrogen or $A^1$ is isopropyl and $A^2$ is hydrogen, or $A^2$ is isopropyl and $A^1$ is hydrogen. These dyes possess very good fastness characteristics.

The compounds of the formulae I and Ia are very lightfast in the plastics from which the sheets used to concentrate light are produced, and convert incident light into fluorescent light in high yield. The wavelength of the emitted fluorescent light is from 500 to 600 nm.

Examples of aromatic and heterocyclic radicals $R^1$ which are substituted in the ortho-position and do not contain any groups which confer solubility in water are:

(a1) radicals of the formula

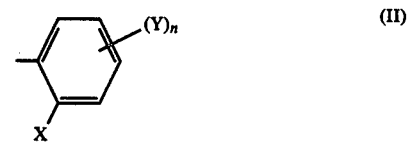

(II)

where

X is chlorine, bromine, $C_1$-$C_8$-alkyl, preferably $C_1$-$C_4$-alkyl, $C_1$-$C_8$-alkoxy, preferably $C_1$-$C_4$-alkoxy, phenyl or

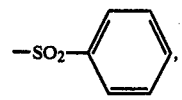

n is 0, 1 or 2, and
Y is chlorine, bromine, $C_1$-$C_4$-alkyl, $C_1$-$C_4$-alkoxy, —NHCOR$^2$, —CONHR$^3$ or

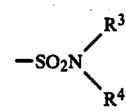

and where
$R^2$ is $C_1$-$C_4$-alkyl or phenyl,
$R^3$ is hydrogen, $C_1$-$C_4$-alkyl or phenyl,
$R^4$ is hydrogen or $C_1$-$C_4$-alkyl or

is a saturated 5-membered or 6-membered heterocyclic ring which may or may not contain —O—, —S— or

as a ring member and

R⁵ is hydrogen or $C_1$-$C_4$-alkyl and if n=2, the substituents may be identical or different.

The phenyl groups in R² and R³ are unsubstituted or substituted by chlorine, bromine, $C_1$-$C_4$-alkyl and/or $C_1$-$C_4$-alkoxy, the number of substituents being up to 3, but preferably 1 or 2;

(a2) radicals of the formula

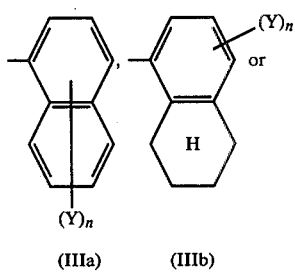 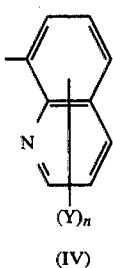

(IIIa)  (IIIb)  (IV)

where

Y and n have the above meanings;

(b) pyrazol-5-yl radicals of the formula

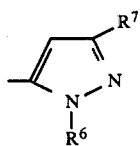

(V)

where

R⁶ is $C_1$-$C_{12}$-alkyl, phenyl or $C_7$-$C_{10}$-phenylalkyl, the phenyl radicals being unsubstituted or substituted by chlorine, bromine, $C_1$-$C_4$-alkyl or $C_1$-$C_4$-alkoxy and the number of substituents being up to 3, but preferably 1 or 2, or furfur-2-yl, and R⁷ is hydrogen or methyl, or (c) benzisothiazol-3-yl radicals of the formula

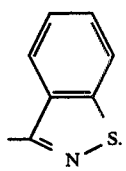

(VI)

Preferred compounds of the formula (I) are those where R¹ is a radical of the formula (II), (IIIa), (IV), (V) or (VI). Amongst these, particularly preferred compounds are those where R¹ is a radical of the formula

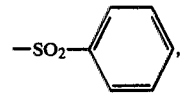

(IIa)  (IIIc)

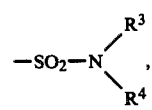

(IIId)  (Va)

where

X' is chlorine, $C_1$-$C_4$-alkyl, $C_1$-$C_4$-alkoxy, phenyl or

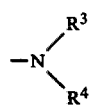

Y' is $C_1$-$C_4$-alkyl, $C_1$-$C_4$-alkoxy, -NHCOR², —CONHR³ or $$-SO_2-N\begin{matrix}R^3\\R^4\end{matrix},$$

R² is phenyl or $C_1$-$C_4$-alkyl,

R³ is hydrogen, $C_1$-$C_4$-alkyl or phenyl,

R⁴ is hydrogen or $C_1$-$C_4$-alkyl or $$-N\begin{matrix}R^3\\R^4\end{matrix}$$

is piperidyl, pyrrolidinyl, morpholinyl, thiomorpholinyl, piperazinyl or N-$C_1$-$C_4$-alkylpiperazinyl, R' is $C_1$-$C_{12}$-alkyl, phenyl or $C_7$-$C_{10}$-phenylalkyl and the phenyl radicals in X', R² and R³ are unsubstituted or substituted by chlorine, $C_1$-$C_4$-alkyl or $C_1$-$C_4$-alkoxy, and the number of substituents is 1 or 2.

Specific examples of R¹ are:

(a1) radicals of the formula (II) which are derived from aniline: 2-methylphenyl; 2,3-, 2,4-, 2,5- and 2,6-dimethylphenyl, 2,4,6-trimethylphenyl, 2-methyl-5-chlorophenyl, 2-methyl-4-chlorophenyl, 2-methyl-4-methoxyphenyl, 2,5-dimethyl-4-methoxyphenyl, 2-methyl-4-methoxy-5-chlorophenyl, 2-methyl-5-(dimethylsulfamyl)-phenyl, 2-ethylphenyl, 2,6-diethylphenyl, 2,6-diethyl-4-methylphenyl, 2-isopropylphenyl, 2,4- and 2,5-diisopropylphenyl, 2-n-butylphenyl, 2-sec.-butylphenyl, 2-n-pentylphenyl, 2-n-hexylphenyl, 2-(2'-methylpentyl)-phenyl, 2-n-octylphenyl, 2-methoxyphenyl, 2-ethoxyphenyl, 2,5-dimethoxyphenyl, 2,5-diethoxyphenyl, 2,4-dimethoxyphenyl, 2,4-dimethoxy-5-chlorophenyl, 2,4-diethoxyphenyl, 2,3-dimethoxyphenyl, 2,3-diethoxyphenyl, 2,3-methylenedioxyphenyl, 2-methoxy-5-acetylaminophenyl, 2-methoxy-4-acetylaminophenyl, 2-methoxy-5-chlorophenyl, 2-methoxy-5-(N-phenylcarbamyl)-phenyl, 2-methyl-5-(4'-methoxybenzoyl)-aminophenyl, 2-phenylphenyl, 2-phenylsulfonyl-phenyl and 2-chlorophenyl; 2,3-, 2,4- and 2,5-dichlorophenyl, 2,4,5- and 2,4,6-trichlorophenyl, 2-bromophenyl, 2,5-dichloro-4-benzoylamino-phenyl, 2,5-dichloro-4-propionylamino-phenyl, 2-chloro-4-N-methylsulfamylphenyl, 2-chloro-4-sulfopyrrolidido-phenyl, 2,5-dichloro-4-N,N-dimethylsulfamylphenyl, 2-chloro-4-methoxyphenyl and 2-chloro-4-ethoxyphenyl;

(a2) radicals of the formulae (IIIa), (IIIb) and (IV), which are derived from 1-naphthylamine or 8-aminoquinoline; naphth-1-yl, 5,6,7,8-tetrahydronaphth-1-yl and quinol-8-yl;

(b) pyrazol-5-yl radicals of the formula (V): 1-methylpyrazol-5-yl; 1-ethylpyrazol-5-yl, 1-n-butylpyrazol-5-yl; 1-(2'-ethylhexyl)-pyrazol-5-yl; 1-phenylpyrazol-5-yl; 1-(4'-chlorophenyl)-pyrazol-5-yl; 1-phenyl-3-methyl-pyrazol-5-yl; 1-(4'-chlorophenyl)-3-methylpyrazol-5-yl; 1-benzylpyrazol-5-yl; 1-(2'-phenylpropyl)-pyrazol-5-yl, 1-(2'-chlorobenzyl)-pyrazol-5-yl, 1-(2',6'-dichlorobenzyl)-pyrazol-5-yl; 1-(2',3'-dimethoxybenzyl)-pyrazol-5-yl, 1-(2'-methoxybenzyl)-pyrazol-5-yl and 1-(furfur-2-yl)-pyrazol-5-yl; and (c) benzisothiazol-3-yl.

Amongst the radicals $R^1$ mentioned, those which do not contain bromine as a substituent are preferred.

Particularly preferred compounds of the formula I are those where $R^1$ is: 2-methylphenyl; 2,3-, 2,4-, 2,5- or 2,6-dimethylphenyl, 2,4,6-trimethylphenyl, 2-ethylphenyl, 2,6-diethylphenyl, 2-isopropylphenyl, 2,4- or 2,5-diisopropylphenyl, 2-methoxyphenyl, 2-chlorophenyl, 2,4- or 2,5-dichlorophenyl, 2-phenylsulfophenyl, 2,5-dichloro-4-benzoylaminophenyl, 2-chloro-4-N-methylsulfamyl-phenyl, 2,5-dichloro-4-N,N-dimethylsulfamylphenyl, 1-benzylpyrazol-5-yl, 1-n-butylpyrazol-5-yl, 1-(4'-chlorophenyl)-pyrazol-5-yl, 1-phenyl-3-methylpyrazol-5-yl or 1-phenylpyrazol-5-yl.

Compounds of the formula I which are very especially preferred, because of their exceptionally good properties, are those where $R^1$ is 2-methylphenyl, 2-chlorophenyl, 2,3-dimethylphenyl, 2,4-dimethylphenyl, 2,5-dimethylphenyl, 2,4-dichlorophenyl, 1-benzylpyrazol-5-yl, 1-n-butylpyrazol-5-yl, 1-(4-chlorophenyl)-pyrazol-5-yl, 1-phenyl-3-methyl-pyrazol-5-yl, 2,6-dimethylphenyl, 2,4,6-trimethylphenyl, 2-isopropylphenyl, 2,4-diisopropylphenyl and 1-phenylpyrazol-5-yl.

The compounds of the formula (I) are known or are prepared in a conventional manner by reacting perylene-3,4,9,10-tetracarboxylic acid or its dianhydride with an amine of the formula $R^1$—$NH_2$.

For example, the novel dyes of the formula Ia may be prepared in a conventional manner by condensing perylene-3,4,9,10-tetracarboxylic acid or its dianhydride with 2-isopropylaniline, 2,4-diisopropyl-aniline or 2,5-diisopropylaniline in a solvent or diluent for example quinoline, naphthalene or trichlorobenzene, or in an excess of the aniline, at an elevated temperature, for example at from 180° to 230° C. The reaction is advantageously carried out in the presence of a condensation accelerator, for example zinc chloride, zinc acetate, zinc propionate or hydrochloric acid.

The dyes are isolated from the reaction mixture in a conventional manner, for example by filtration. Advantageously, the filtration is carried out at an elevated temperature, e.g. 80°–120° C., where appropriate after diluting the reaction mixture with an inert solvent, for example a lower carboxylic acid amide, e.g. formamide, an aromatic solvent, e.g. toluene or chlorobenzene, or, preferably, an alcohol, e.g. methanol, ethanol or isobutanol.

To remove any residual traces of perylene-3,4,9,10-carboxylic acid, the dyes may be boiled with dilute sodium hydroxide solution or sodium carbonate solution.

If required, the dyes may be purified yet further, for example by fractional precipitation from concentrated sulfuric acid, by recrystallization from high-boiling easily removable solvents or by extraction with a boiling solvent whilst being milled. If necessary, the purification process is repeated once or several times, or different purification processes are combined, in order to obtain a very pure compound (I).

For use in concentrating light, the compounds (I) are incorporated into an appropriate plastic for this application. To do so, the granular plastic is dusted with the requisite amount of (I), and the granules are then extruded to form a sheet-like structure. Examples of preferred plastics for use in concentrating light for solar cells are poly(methyl methacrylate), poly(methyl acrylate), polystyrene, poly(diethylene glycol diallyl-bis-carbonate) and appropriate nylons and polycarbonates.

The novel dyes of the formula Ia are exceptionally suitable for coloring plastics, especially for mass-coloring thermoplastics. They give very clear, luminous, fluorescent orange colorations which are very lightfast. They may also be used in a mixture with other dyes for coloring plastics, and again very clear, brilliant colorations are obtained. Furthermore, the novel dyes are exceptionally useful for the production of plastic sheets for concentrating light, of the type described in German Laid-Open Application DOS No. 2,620,115, in which they serve as fluorescence centers.

Perylenetetracarboxylic acid bis-arylimides, for example the industrially useful arylimides derived from p-aminoazobenzene, p-phenetidine, p-anisidine, 3,5-dimethylaniline or p-chloroaniline, at normal processing temperatures give red colorations which do not fluoresce. In contrast, the novel dyes give luminous orange colorations which are transparent and fluoresce in daylight. The novel dyes are also substantially more easily soluble in organic solvents and in plastics than are, for example, the above bis-arylimides. Because of their greater solubility, much better distribution in the plastic is achievable with the novel dyes, so that special fine dispersion treatments or finishing treatments prior to use are not absolutely essential.

The Examples which follow illustrate the invention. Parts and percentages are by weight.

EXAMPLE 1

0.01% of the dye of the formula

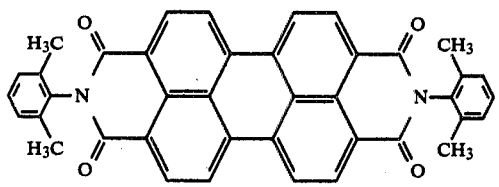

is dissolved and homogeneously dispersed in molten poly(methyl acrylate), which is then converted to fluorescent sheets.

EXAMPLE 2

1,000 parts of poly(methyl acrylate) granules are dusted uniformly with 0.05 part of the dye of the formula

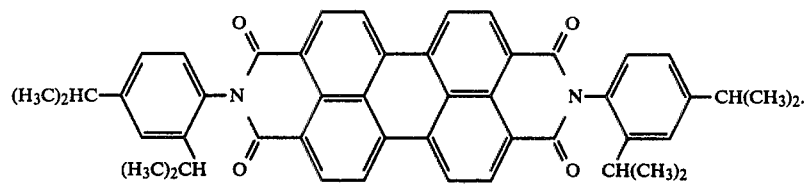

The mixture is then extruded to form sheets.

EXAMPLES 3 TO 22

Fluorescent sheets are prepared, by the method of Example 1 or 2, using a dye of the formula

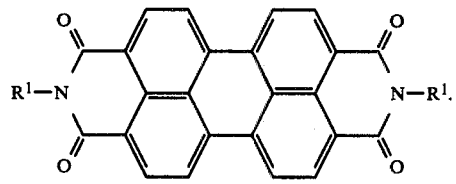

The meanings of $R^1$, and the plastic used, are shown in the Table below.

| Example | $R^1$ | Material |
|---|---|---|
| 3 | ⌬—CH$_3$ (o-tolyl) | Poly(methyl methacrylate) |
| 4 | ⌬—C$_2$H$_5$ | " |
| 5 | ⌬—CH(CH$_3$)$_2$ (o-isopropylphenyl) | " |
| 6 | ⌬—OCH$_3$ (o-methoxyphenyl) | " |
| 7 | 2,4,6-trimethylphenyl (CH$_3$, H$_3$C-, CH$_3$) | " |
| 8 | " | Poly(ethylene glycol diallyl-bis-carbonate) |
| 9 | 2,6-dimethylphenyl | Poly(ethylene glycol diallyl-bis-carbonate) |
| 10 | ⌬—OC$_2$H$_5$ | Poly(ethylene glycol diallyl-bis-carbonate) |
| 11 | 2,4-dimethylphenyl (CH$_3$, H$_3$C-) | Poly(ethylene glycol diallyl-bis-carbonate) |
| 12 | 2,5-dimethylphenyl (CH$_3$, H$_3$C-) | Poly(methyl methacrylate) |

-continued

| Example | R¹ | Material |
|---|---|---|
| 13 | 1-phenylpyrazol-3-yl | " |
| 14 | 2-chlorophenyl | " |
| 15 | 4-chloro-2-methylphenyl | " |
| 16 | naphthalen-1-yl | " |
| 17 | quinolin-8-yl | " |
| 18 | 2,4-dichlorophenyl | " |
| 19 | 2,3-dimethylphenyl | " |
| 20 | 2-(phenylsulfonyl)phenyl | " |
| 21 | 4-chloro-3-(N-methylsulfamoyl)phenyl | " |
| 22 | 2,5-dichloro-4-(benzoylamino)phenyl | " |
| 23 | 2,5-dichloro-4-(N,N-dimethylsulfamoyl)phenyl | " |
| 24 | 2-isopropyl-4-isopropylphenyl | " |
| 25 | 2,4-dichlorophenyl | " |
| 26 | 1-benzylpyrazol-3-yl | " |
| 27 | 1-butylpyrazol-3-yl | " |
| 28 | 1-(4-chlorophenyl)pyrazol-3-yl | " |
| 29 | 3-methyl-1-phenylpyrazol-5-yl | " |

11

-continued

| Example | R¹ | Material |
|---|---|---|
| 30 | (structure: 4-methyl-3-(dimethylsulfamoyl)phenyl) | " |
| 31 | (structure: 2,3-diethylphenyl) | " |
| 32 | (structure: 4-chloro-2-methylphenyl) | " |

EXAMPLE 33

The procedure described in Example 2 is followed, but using the dye of the formula

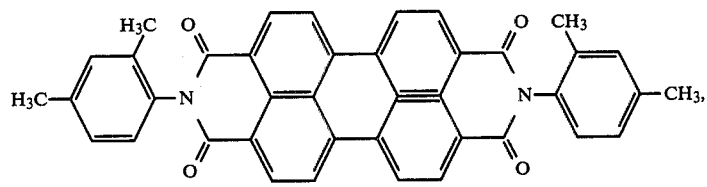

with poly(methyl methacrylate) as the medium.

EXAMPLE 34

40.8 parts of crystalline zinc acetate, 117 parts of perylenetetracarboxylic acid and 135 parts of 2,4-diisopropylaniline are introduced into 840 parts of quinoline at 100° C. The mixture is heated to 225°–230° C., whilst passing a slight stream of nitrogen over it, and is kept at the said temperature until a sample, when worked up and boiled with dilute sodium carbonate solution, no longer shows any perylenetetracarboxylic acid. This is found to be the case after about 2 hours. When the mixture has cooled to about 100° C., it is filtered and the filter residue is washed successively with quinoline, methanol and water and stirred into about 1,200 parts of 2% strength aqueous sodium carbonate solution; this mixture is heated to about 95° C. and is filtered, and the filter residue is washed with water until the filtrate is neutral. This removes any residual traces of perylenetetracarboxylic acid. The product is dried, giving a very good yield of the dye.

If the procedure described above is used, but replacing the 2,4-diisopropylaniline by the same amount of 2,5-diisopropylaniline or by 99 parts of 2-isopropylaniline, perylenetetracarboxylic acid N,N'-bis-(2',5'-diisopropylanilide) and N,N'-bis-(2'-isopropylanilide), respectively, are obtained in very good yield.

COLORATION OF PLASTICS 0.05 part of perylene-3,4,9,10-tetracarboxylic acid bis-(2',4'-diisopropylanilide) is dry-blended, in a high-speed mixer, with 100 parts of milled mass-polymerized polystyrene. The mixture is melted, and homogenized, in an extruder at a barrel temperature of 200°–250° C. The colored plastic mass is granulated by die face-cutting or by drawing strands and cooling, and chopping, these. The granules obtained are then injection-molded at 200°–250° C. or compression-molded into various shapes. Luminous orange injection moldings or compression moldings, which fluoresce and are very light-fast, are obtained.

Instead of mass-polymerized polystyrene, it is also possible to use emulsion-polymerized polystyrene, suspension-polymerized polystyrene or a copolymer of styrene with butadiene and acrylonitrile or acrylic esters.

Very similar colorations, having virtually the same properties, are obtained if instead of perylene-3,4,9,10-tetracarboxylic acid N,N'-bis-(2',4'-diisopropylanilide), perylene-3,4,9,10-tetracarboxylic acid N,N'-bis-(2',5'-diisopropylanilide) or perylene-3,4,9,10-tetracarboxylic acid N,N'-bis-(2'-isopropylanilide) is used.

We claim:

1. A perylene-3,4,9,10-tetracarboxylic acid diimide dye of the formula

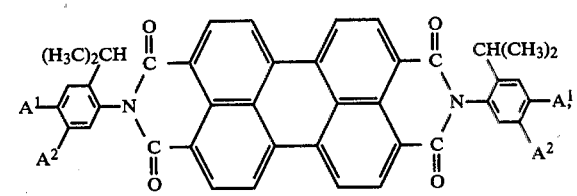

where $A^1$ and $A^2$ are hydrogen or $A^1$ is isopropyl and $A^2$ is hydrogen or $A^2$ is isopropyl and $A^1$ is hydrogen.

2. A dye as claimed in claim 1, wherein $A^1$ or $A^2$ is isopropyl.

3. A dye as claimed in claim 1, wherein $A^1$ is isopropyl.

* * * * *